United States Patent
Yoshida et al.

(10) Patent No.: US 7,541,810 B2
(45) Date of Patent: Jun. 2, 2009

(54) RF COIL AND MAGNETIC RESONANCE IMAGING APPARATUS

(75) Inventors: Masaru Yoshida, Tokyo (JP); Kenichi Nukihara, Tokyo (JP); Masahiro Fujimoto, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 11/689,251

(22) Filed: Mar. 21, 2007

(65) Prior Publication Data
US 2007/0229074 A1 Oct. 4, 2007

(30) Foreign Application Priority Data
Mar. 28, 2006 (JP) .............................. 2006-087980

(51) Int. Cl.
*G01V 3/00* (2006.01)
(52) U.S. Cl. ....................... 324/318; 324/322
(58) Field of Classification Search ................. 324/318, 324/319, 322
See application file for complete search history.

(56) References Cited

U.S. PATENT DOCUMENTS

| 5,594,337 | A |  | 1/1997 | Boskamp |
| 5,696,449 | A |  | 12/1997 | Boskamp |
| 5,898,306 | A | * | 4/1999 | Liu et al. ..................... 324/322 |
| 6,348,794 | B1 |  | 2/2002 | Nabetani et al. |
| 6,459,265 | B1 | * | 10/2002 | Lou et al. .................... 324/322 |
| 6,512,374 | B1 | * | 1/2003 | Misic et al. ................. 324/319 |
| 6,590,392 | B2 |  | 7/2003 | Boskamp et al. |
| 6,624,633 | B1 |  | 9/2003 | Zou et al. |
| 6,768,303 | B1 |  | 7/2004 | Su et al. |

FOREIGN PATENT DOCUMENTS

JP 2003-290168 10/2003

OTHER PUBLICATIONS

E.B. Boskamp; Fast Drop Off Cylindrical RF Transmit Coils; Proc. Intl. Soc. Mag. Reson. Med. 10(2002); 1 pg.
Masaru Yoshida; "RF Coil and Magnetic Resonance Imaging Apparatus"; U.S. Appl. No. 11/550,920, filed Oct. 19, 2006; 19 pgs.

* cited by examiner

*Primary Examiner*—Louis M Arana
(74) *Attorney, Agent, or Firm*—Armstrong Teasdale LLP

(57) ABSTRACT

For the purpose of making available an RF coil which makes possible a reduction in elements to be controlled in varying the size of the RF coil, there are provided an original loop unit, a conductor so connected to the original loop unit as to split the original loop unit into split loop units, a capacitor connected in series to the conductor, and switching means which makes the conductor either conductive or non-conductive, wherein the electrostatic capacitance of the capacitor is so set as not to allow the split loop units to interfere with each other when the conductor is made conductive by the switching means.

20 Claims, 5 Drawing Sheets (a)

(b)

RF COIL AND MAGNETIC RESONANCE IMAGING APPARATUS

CROSS REFERENCE TO RELATED APPLICATIONS

This application claims the benefit of Japanese Application No. 2006-087980 filed Mar. 28, 2006.

BACKGROUND OF THE INVENTION

The present invention relates to an RF coil and a magnetic resonance imaging apparatus.

There are known magnetic resonance imaging apparatuses whose RF coils are made variable in size to save the trouble of RF coil reinstallation or replacement to alter the size of the field of view (FOV) (see Patent Document 1 for example). The RF coil disclosed in Patent Document 1 is shown in FIG. 6 in a partially abridged way. According to Patent Document 1, a conductor 504 is provided to split a loop unit 501 into a loop unit 502 and a loop unit 503. The loop unit 502 is provided with a receiver unit 505, the conductor 504 is provided with a switch 506 for changing over the conductance state, and the loop unit 503 is provided with a switch 507 for changing over the conductance state. And, while reception by the loop unit 501 of the larger size is made possible by placing the switch 506 in a non-conductive state and the switch 507 in a conductive state, reception by the loop unit 502 of the smaller size is made possible by placing the switch 506 in a conductive state and the switch 507 in a non-conductive state.

[Patent Document 1] JP-A No. 290168/2003

However, the technique described above, as it uses two switches, invites complexity of control and an increase in the number of components.

SUMMARY OF THE INVENTION

Therefore, an object of the present invention is to provide an RF coil and a magnetic resonance imaging apparatus which make possible a reduction in elements to be controlled in varying the RF coil size.

The RF coil of a magnetic resonance imaging apparatus according to the invention comprises a conductor so connected to the original loop unit as to split the original loop unit into a plurality of split loop units, an electrostatic capacitance element connected in series to the conductor, and switching means which makes the conductor either conductive or non-conductive, wherein the electrostatic capacitance of the electrostatic capacitance element is so set as not to allow the plurality of split loop units to interfere with each other when the conductor is made conductive by the switching means.

It is preferable for the electrostatic capacitance of the electrostatic capacitance element to be so set to hold $Cm=1/(\omega 2M)$, where Cm is the synthetic static capacitance on the conductor shared by the two mutually adjoining split loop units, M is the mutual inductance between the two split loop units, and $\omega$ is the resonance frequency of the original loop unit or the split loop units.

It is preferable for the electrostatic capacitance of the electrostatic capacitance element to be so set as to equalize the resonance frequency of the original loop unit and the resonance frequency or frequencies of at least any of the plurality of split loop units.

It is preferable for the switching means to include a parallel oscillation circuit, comprising a switch-over electrostatic capacitance element connected in series to the conductor, an inductance element connected in parallel to the switch-over electrostatic capacitance element, and a diode connected in series to the inductance element.

A magnetic resonance imaging apparatus according to the present invention comprises a magnetostatic field forming unit which forms a magnetostatic field, a gradient magnetic field forming unit which forms a gradient magnetic field, an RF coil which performs at least either the application of a high frequency magnetic field in a subject within the magnetostatic field or the reception of magnetic resonance signals from the subject, and an image forming unit which forms tomographic images of the subject on the basis of the magnetic resonance signals which have been received. The RF coil is provided with an original loop unit, a conductor which is so connected to the original loop unit as to split the original loop unit into a plurality of split loop units, an electrostatic capacitance element connected in series to the conductor, and switching means which makes the conductor either conductive or non-conductive. The electrostatic capacitance of the electrostatic capacitance element is so set as not to allow the plurality of split loop units to interfere with each other when the conductor is made conductive by the switching means.

It is preferable for a receiver unit to be further provided, the receiver unit being connected to one of the plurality of split loop units and amplifying, when the conductor is conductive, the magnetic resonance signals received from the pertinent split loop unit or amplifying, when the conductor is non-conductive, the magnetic resonance signals received from the original loop unit.

It is preferable for the electrostatic capacitance of the electrostatic capacitance element to be so set as to equalize the resonance frequency of the original loop unit and the resonance frequency the split loop unit to which the receiver unit is connected.

It is preferable for control means for controlling the operation of the switching means to be further provided.

EFFECTS OF THE INVENTION

According to the invention, it is made possible to reduce elements to be controlled in varying the RF coil size.

Further objects and advantages of the present invention will be apparent from the following description of the preferred embodiments of the invention as illustrated in the accompanying drawings.

DETAILED DESCRIPTION OF THE INVENTION (First Mode for Implementation)

Figure 1:
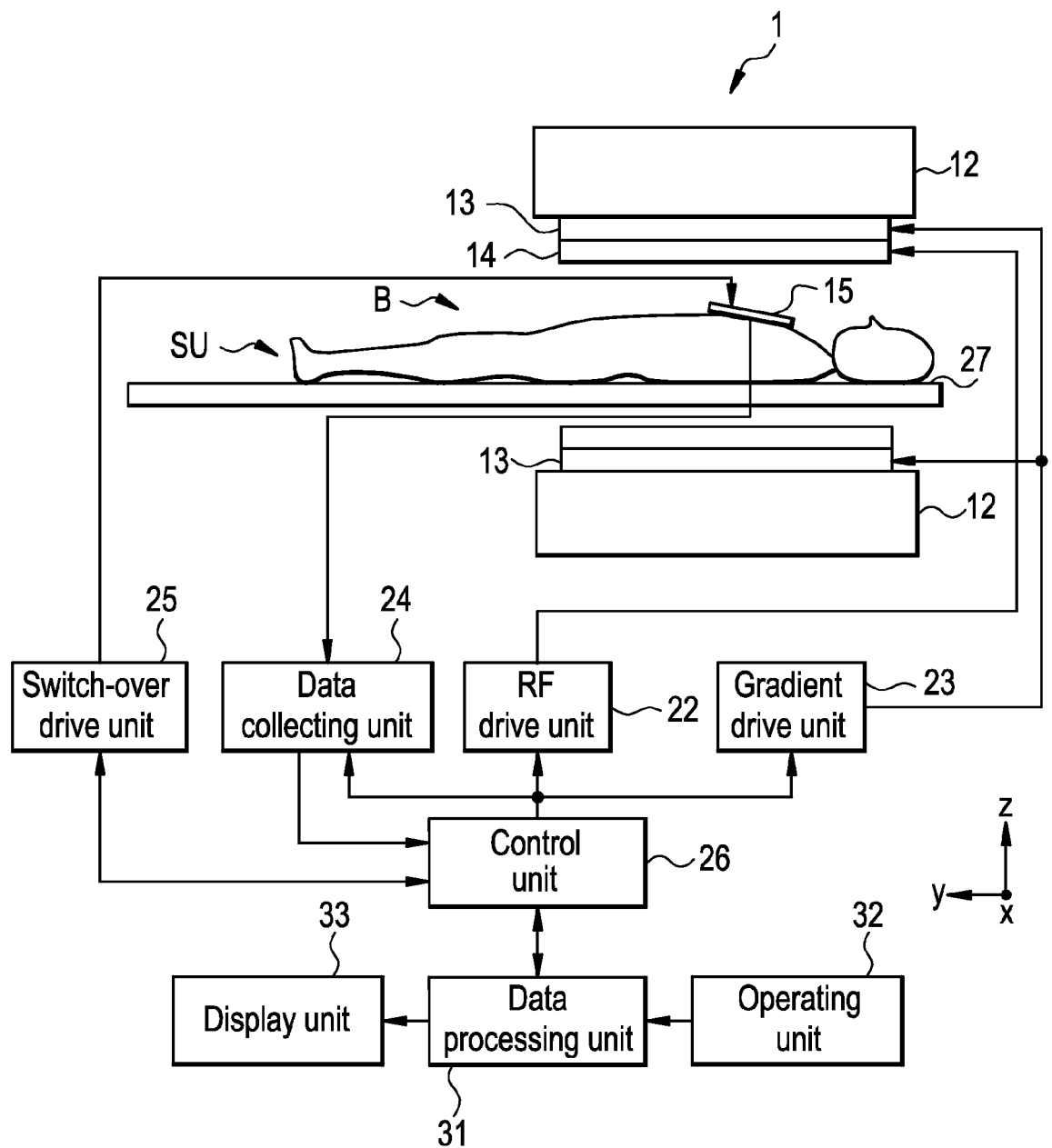
FIG. 1 is a block diagram showing a magnetic resonance imaging apparatus 1 in the first mode for implementing the present invention.

FIG. 1 is a block diagram showing a magnetic resonance imaging apparatus (MRI) 1 in this mode for implementing the invention. The magnetic resonance imaging apparatus has a magnetostatic magnet unit 12, gradient coils 13, an RF or reception coil 15, a transmission coil 14, an RF drive unit 22, a gradient drive unit 23, a data collecting unit 24, a switch-over drive unit 25, a control unit 26, a cradle 27, a data processing unit 31, an operation unit 32, and a display unit 33.

The magnetostatic magnet unit 12 is intended for forming a magnetostatic field in an imaging space B in which a subject is accommodated. The magnetostatic magnet unit 12 is configured of a pair of permanent magnets. And the magnetostatic magnet unit 12 is so configured that the direction of the magnetostatic field is in the direction of the body axis of the subject SU or a direction normal to the body axis. Incidentally, the magnetostatic magnet unit 12 may as well be configured of superconducting magnets.

The gradient coils 13 form a gradient magnetic field in the imaging space B in which a magnetostatic field is formed, and adds positional information to magnetic resonance signals received by the RF coil 14. The gradient coils 13 have, for instance, three lines including a gradient coil for forming a frequency encoding gradient magnetic field, a gradient coil for forming a phase encoding gradient magnetic field and a gradient coil for forming a slice selecting gradient magnetic field.

The transmission coil 14 forms a high frequency magnetic field by transmitting an RF pulse, which is an electromagnetic wave, to the subject in the imaging space B in which a magnetostatic field is formed by the magnetostatic magnet unit 12, and excites the spinning of protons in the imaging area of the subject SU.

The reception coil 15 receives and outputs, as magnetic resonance signals, an electromagnetic wave generated from the protons excited by the transmission coil 14 in the subject SU. The reception coil 15 is configured of, for instance, a surface coil to be arranged on the body surface of the subject SU.

The RF drive unit 22 drives the transmission coil 14 to output to the transmission coil 14 a drive signal for forming a high frequency magnetic field in the imaging space B. More specifically, it has a gate modulator (not shown), an RF power amplifier (not shown) and an RF oscillator (not shown). The RF drive unit 22 converts, in accordance with a control signal from the control unit 26, the RF signal from the RF oscillator into a signal of a prescribed timing and a prescribed envelope by using the gate modulator. And, it outputs to the transmission coil 14 the RF signal modulated by the gate modulator after amplifying it with the RF power amplifier.

The gradient drive unit 23 drives, in accordance with a control signal from the control unit 26, the gradient coil 13 by applying a gradient pulse to the gradient coil 13 to generate a gradient magnetic field in the imaging space B in which a magnetostatic field is formed. The gradient drive unit 23 has three lines of drive circuits (not shown) matching the three lines of gradient coils 13.

The data collecting unit 24 collects, in accordance with a control signal from the control unit 26, magnetic resonance signals received by the reception coil 15 and outputs them to the data processing unit 31. The data collecting unit 24 so collects the magnetic resonance signals having undergone phase encoding and frequency encoding as to match k spaces. In the data collecting unit 24, after a phase detector subjects the magnetic resonance signals received by the reception coil 15 to phase detection with the output of the RF oscillator of the RF drive unit 22 as a reference signal, an A/D converter converts the magnetic resonance signals, which are analog signals, into digital signals. And the collected magnetic resonance signals, after they are stored into a memory, are outputted to the data processing unit 31.

The switch-over drive unit 25 controls the operation of a switch-over unit for carrying out size alteration of the reception coil 15 to be described afterwards. More specifically, in accordance with a control signal from the control unit 26, it applies to the switch-over unit a bias voltage in the forward direction or the backward direction.

The control unit 26 has a computer and a program to cause the computer to so execute the functions of various units to match a prescribed pulse sequence. And the control unit 26 performs control by outputting, in accordance with an operation signal inputted from the operation unit 32 via the data processing unit 31, control signals to cause each of the RF drive unit 22, the gradient drive unit 23 and the data collecting unit 24 to execute a prescribed pulse sequence.

The cradle 27 is a table on which the subject SU is to be mounted. The cradle 27 moves, in accordance with a control signal from the control unit 26, between the inside and the outside of the imaging space B.

The data processing unit 31 has a computer and a program to cause the computer to execute prescribed data processing. The data processing unit 31 is connected to the operation unit 32, and operation signals from the operation unit 32 are inputted to it. And the data processing unit 31, connected to the control unit 26, outputs to the control unit 26 the operation signals inputted by the operator to the operation unit 32. The data processing unit 31, also connected to the data collecting unit 24, acquires magnetic resonance signals collected by the data collecting unit 24, and subjects the acquired magnetic resonance signals to image processing to generate an image regarding a slice of the subject. And the data processing unit 31 outputs the generated image to the display unit 33. Incidentally, the data processing unit 31 functions as an image generating unit.

The operation unit 32 is configured of an operating device, such as a keyboard or a mouse. The operation unit 32 is operated by an operator, and outputs to the data processing unit 31 operation signals according to his or her operation.

The display unit 33 is configured of a display device, such as a CRT. The display unit 33 displays an image regarding a slice of the subject generated on the basis of magnetic resonance signals from the subject SU.

Figure 2:
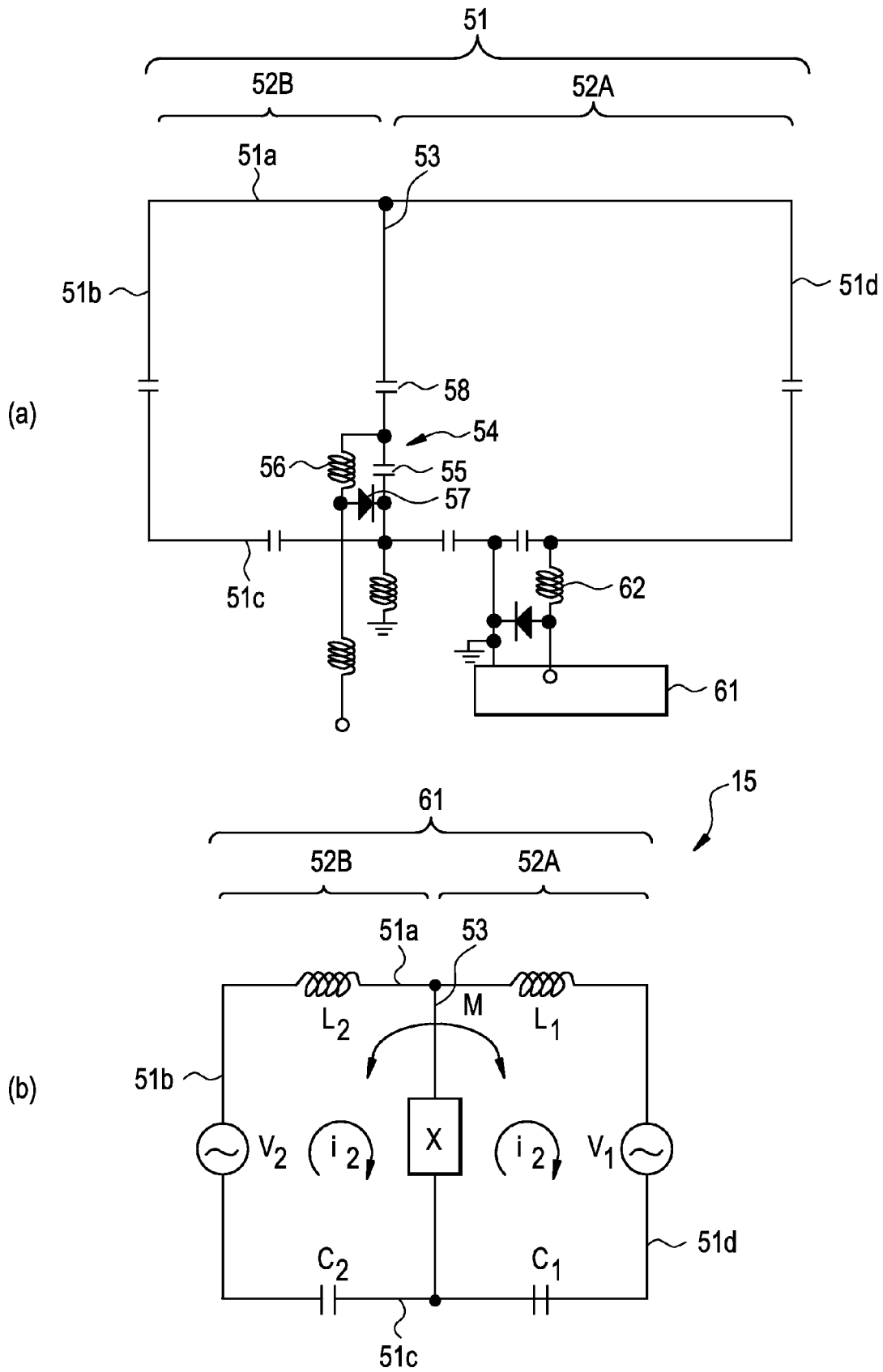
FIGS. 2a and 2b are partially abridged circuit diagrams showing the configuration of the transmission coil of the magnetic resonance imaging apparatus of FIG. 1.

FIG. 2 (a) is a circuit diagram showing the configuration of the reception coil 15. Some elements including the inductor are omitted in the illustration, though.

The reception coil 15 is provided with an original loop unit 51 and a conductor 53 connected to the original loop unit 51 so that the original loop unit 51 can be split into two split loop units 52A and 52B. A switch-over unit 54 for switching over the conductance state is also connected to the conductor 53, a receiver unit 61 contained in the data collecting unit 24 is connected to the split loop unit 52A, and the reception coil 15 is so configured that reception by the original loop unit 51 or reception by the split loop unit 52A can be selected by the switch-over unit 54 as it switches over the conductance state.

The original loop unit 51 is formed, for instance, in a substantially rectangular shape, and is provided with four linear elements 51a through 51d. The original loop 51 may be set in a circular or some other appropriate shape. A capacitor, inductor and the like are appropriately connected in series to the original loop 51 so as to configure a resonance circuit whose resonance frequency is a prescribed operation frequency.

The split loop units 52A and 52B are formed as a result of the connection of the conductor 53 to the mutually opposing elements 51a and 51c of the original loop unit 51 and the splitting of the original loop unit 51, each containing part of the elements of the original loop unit and the conductor 53. The conductor 53 is shared by the split loop units 52A and 52B.

The conductor 53 is formed of the same material and in the same sectional shape as, for instance, the elements 51a through 51d of the original loop unit 51. The conductor 53 also is formed in a linear shape, for instance, from the elements 51a through 51c, and shapes the split loop units 52A and 52B substantially in rectangles. The conductor 53 is provided with a capacitor or an inductor as required so as to cause the split loop unit 52A to configure a resonance circuit whose resonance frequency is a prescribed operation frequency.

The switch-over unit 54, configured of a parallel oscillation circuit whose resonance frequency is the operation frequency of the reception coil 15 for instance, is provided with a capacitor 55 connected in series to the conductor 53, an inductor 56 connected in parallel to the capacitor 55, and a diode 57 connected in series to the inductor 56. The switch-over drive unit 25 is connected to the anode or the cathode of the diode 57, and the application of a bias in the forward direction or the backward direction causes the switch-over unit 54 to make the conductor 53 conductive or non-conductive.

Incidentally, FIG. 2(a) shows by way of example a case in which the diode 57 is so connected that the switch-over unit 54 functions as a parallel oscillation circuit and makes the conductor 53 in a non-conductive state when a bias in the forward direction is applied to the diode 57. The switch-over unit 54 becomes equivalent to the capacitor 55 and makes the conductor 53 in a conductive state when a bias in the backward direction is applied to the diode 57.

The receiver unit 61 amplifies signals outputted from the original loop unit 51 or the split loop unit 52A and outputs them to a detector circuit or the like. The receiver unit 61 is connected to part of the element 51c contained in the split loop unit 52A via a switch 62. The switch 62, configured of a parallel oscillation circuit whose resonance frequency is the operation frequency of the RF coil 15 for instance, is so controlled by the control unit 26 as to make the element 51c and the receiver unit 61 non-conductive at the time of transmission and to make the element 51c and the receiver unit 61 conductive at the time of reception. The switch 62 also functions as a matching circuit at the time of reception.

In the reception coil 15 described above, when the conductor 53 is made non-conductive by the switch-over unit 54, the original loop unit 51 receives a magnetic resonance signal and outputs it to the receiver unit 61, or when the conductor 53 is made conductive, the split loop unit 52A receives the magnetic resonance signal and outputs it to the receiver unit 61. And when the magnetic resonance signal is received by the split loop unit 52A and outputted to the receiver unit 61, an electrostatic capacitance is set on the conductor 53 so that the split loop unit 52A and the split loop unit 52B may not interfere with each other. A more specific description follows.

FIG. 2(b) is a circuit diagram showing an equivalent circuit to the RF coil 15. Capacitors C1 and C2, and inductors L1 and L2 respectively represent capacitors and inductors equivalent to all the capacitors and inductors on the elements 51a through 51d of the split loop units 52A and 52B, and an element X represents an element equivalent to every element having an impedance on the conductor 53. The mutual inductance of the split loop units 52A and 52B is represented by M. Supposing that voltages $V_1$ and $V_2$ are applied and currents i1 and i2 flow to the split loop units 52A and 52B, respectively, the following equations will hold.

$$V_1 = X_{C1}i_1 + X_{L1}i_1 + X_{i1} - X_{i2} - X_{Mi2}$$

$$V_2 = X_{C2}i_2 + X_{L2}i_2 + X_{i2} - X_{i1} - X_{Mi1}$$

where $X_{C1}$, $X_{C2}$, $X_{L1}$, $X_{L2}$, X and $X_M$ are the respective impedances of the capacitors C1 and C2, the inductors L1 and L2, the element X and the mutual inductance M.

To rearrange the foregoing equations:

$$V_1 = (X_{C1} + X_{L1} + X)i_1 - (X + X_M)i_2$$

$$V_2 = -(X + X_M)i_1 + (X_{C2} + X_{L2} + X)i_2$$

If the split loop units 52A and 52B are isolated from each other, in other words if each of them is unaffected by other's current, the term of crosstalk will be 0, and therefore:

$$-(X + X_M)i_2 = 0$$

$$-(X + X_M)i_1 = 0$$

and $$X + X_M = 0$$

Therefore, the following will hold:

$$X = -X_M = -j\omega M = 1/(j(1/(\omega M)))$$

As this represents a static capacitance, X=Cm being supposed.

$$\omega Cm = 1/(\omega M)$$

$$\therefore Cm = 1/(\omega^2 M)$$

Incidentally, ω is the operation frequency of the RF coil 15.

Therefore, if the static capacitance of the capacitors on the conductor 53 is so set as to make the static capacitance Cm resulting from the synthesis of the static capacitance on the conductor 53 to be $1/(\omega^2 M)$, interference between the split loop units 52A and 52B will be restrained when the conductor 53 is made conductive and magnetic resonance signals are received with the split loop unit 52A. Incidentally, the capacitors on the conductor 53 include, for instance, the capacitor 55 contained in the switch-over unit 54 and a capacitor 58 separately from the switch-over unit 54 (see FIG. 2(a)).

Incidentally, the static capacitance Cm on the conductor 53 is so set as to equalize the resonance frequency (operation frequency) of the original loop unit 51 and the resonance frequency (operation frequency) of the split loop unit 52A. Thus:

$$\omega = 1/(L_{12} \times C_{12})^{1/2}$$

$$= 1/(L_{1m} \times C_{1m})^{1/2}$$

Here, $L_{12}$ and $C_{12}$ are the inductance and the static capacitance of the whole loop unit 51, and $L_{1m}$ and $C_{1m}$, inductance and the static capacitance of the whole split loop unit 52A.

In the mode for implementation described above, since the electrostatic capacitance Cm on the conductor 53 is so set that the split loop unit 52A and the split loop unit 52B may not interfere with each other, the split loop unit 52B need not be made non-conductive when reception is to be accomplished with the split loop unit 52A. Therefore, the switches are reduced which otherwise would have to be controlled when the loop unit to be used is switched over between the original loop unit 51 and the split loop unit 52A to alter the FOV size of the RF coil 15.

To add, though the first mode for implementation is a case in which the present invention is applied to the reception coil 15, the invention may as well be applied to the transmission coil or a combined transmission/reception coil. Also, the number of units into which the original loop unit is split may be greater than two, and stepwise size alteration may as well be made possible.

(Second Mode for Implementation)

A second mode for implementation has a similar configuration to the first mode for implementation shown in FIG. 1. In the following account, the same constituent elements in the first mode for implementation will be denoted by respectively the same reference signs as in the first mode for implementation, and their description will be omitted.

In the second mode for implementation, an RF coil 50 which both applies a high frequency magnetic field to the subject and receives magnetic resonance signals is provided in place of the reception coil 14 and the transmission coil 15 of FIG. 1. The RF coil 50 is connected to an RF drive unit 22, a data collecting unit 24 and a switch-over drive unit 25.

Figure 3:
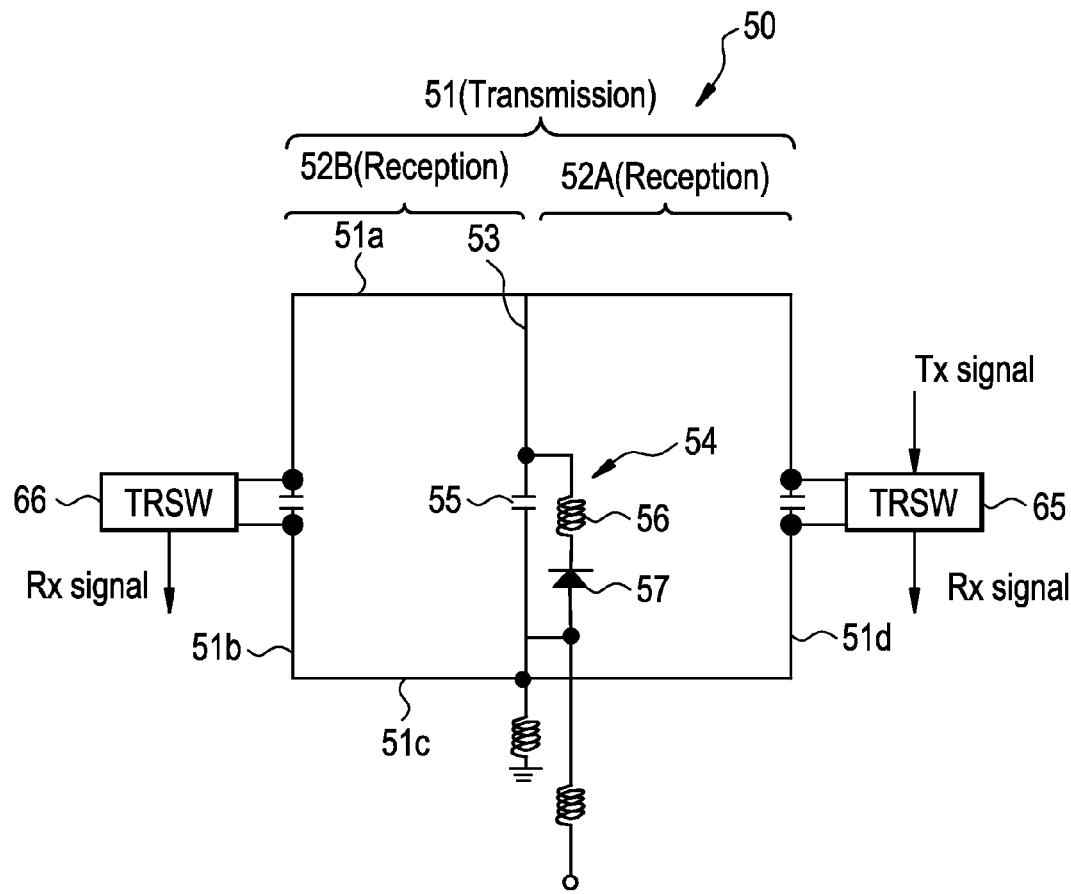
FIG. 3 is a partially abridged circuit diagram showing the configuration of the RF coil in a second mode for implementing the invention.

FIG. 3 is a circuit diagram showing the configuration of the RF coil 50. The RF coil 50, similarly to the transmission coil 15 in the first mode for implementation, is provided with an original loop unit 51, split loop units 52, a conductor 53 and a switch-over unit 54 among others.

However, in the RF coil 50, the data collecting unit 24 is connected to both of the split loop units 52A and 52B, and the RF drive unit 22 is connected to the split loop unit 52A, with the switch-over unit 54 performing switching-over during the imaging operation. Also, a capacitor and others are provided on the conductor 53 to cause each of the split loop units 52A and 52B to constitute a parallel oscillation circuit whose resonance frequency is the operation frequency.

The split loop unit 52A is connected to the RF drive unit 22 and the data collecting unit 24 via a TR switch 65. The TR switch 65 selectively makes the split loop unit 52A and either the RF drive unit 22 or the data collecting unit 24 conductive. The TR switch 65 is configured to include, for instance, a switch which makes the split loop unit 52A and the RF drive unit 22 conductive or non-conductive and a switch which makes the split loop unit 52A and the data collecting unit 24 conductive or non-conductive, each switch including, for example, a parallel oscillation circuit, an FET, and the like. The operation of the TR switch 65 is controlled by the control unit 26.

The split loop unit 52B is connected to the data collecting unit 24 via a TR switch 66. The TR switch 66 makes the split loop unit 52A and the split loop unit 52B and the data collecting unit 24 conductive or non-conductive. The TR switch 66 includes, for example, a parallel oscillation circuit, an FET and the like. Incidentally, the TR switch 66 may have the same configuration as the TR switch 65. The operation of the TR switch 66 is controlled by the control unit 26.

Figure 4:
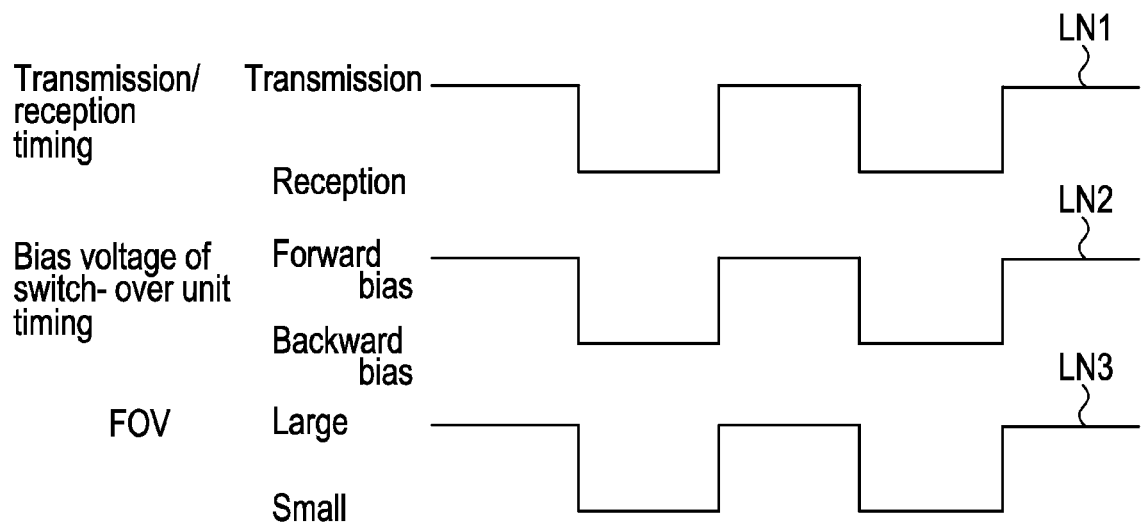
FIG. 4 is a time chart showing the methods of transmission and reception by the RF coil of FIG. 3.

FIG. 4 is a time chart showing the method of control of the switch-over unit 54 by the control unit 26. In FIG. 4, the horizontal axis is the time.

As indicated by solid line LN1, transmission and reception by the RF coil 50 are performed alternately at regular intervals of time. During transmission, the TR switch 65 makes the split loop unit 52A and the RF drive unit 22 conductive and makes the split loop unit 52A and the data collecting unit 24 non-conductive. The TR switch 66 makes the split loop unit 52B and the data collecting unit 24 non-conductive. And as indicated by solid line LN2, a bias voltage in the forward direction is applied to the diode 57 of the switch-over unit 54 to place the conductor 53 in a non-conductive state. Therefore, transmission is performed by the original loop unit 51 and, as indicated by solid line LN3, FOV is set large.

On the other hand, during reception, the TR switch 65 makes the split loop unit 52A and the RF drive unit 22 non-conductive and makes the split loop unit 52A and the data collecting unit 24 conductive. The TR switch 66 makes the split loop unit 52B and the data collecting unit 24 conductive. And as indicated by solid line LN2, a bias voltage in the backward direction is applied to the diode 57 of the switch-over unit 54 to place the conductor 53 in a conductive state. Therefore, reception is performed by each of the split loop units 52A and 52B and, as indicated by solid line LN3, FOV of each loop unit is set small.

Incidentally, the data processing unit 31 generates an image based on signals received by the split loop units 52A and 52B.

In the mode for implementation described above, since the application of a high frequency magnetic field is accomplished by the original loop unit 51 and reception is performed by the split loop units 52A and 52B, reception can be carried out by a plurality of coils while uniformly exciting magnetic resonance signals.

(Third Mode for Implementation)

A third mode for implementation has a similar configuration to the second mode for implementation. However, the configuration of the RF coil is different from that in the second mode for implementation. In the following account, the same constituent elements in the second mode for implementation will be denoted by respectively the same reference signs as in the second mode for implementation, and their description will be omitted.

Figure 5:
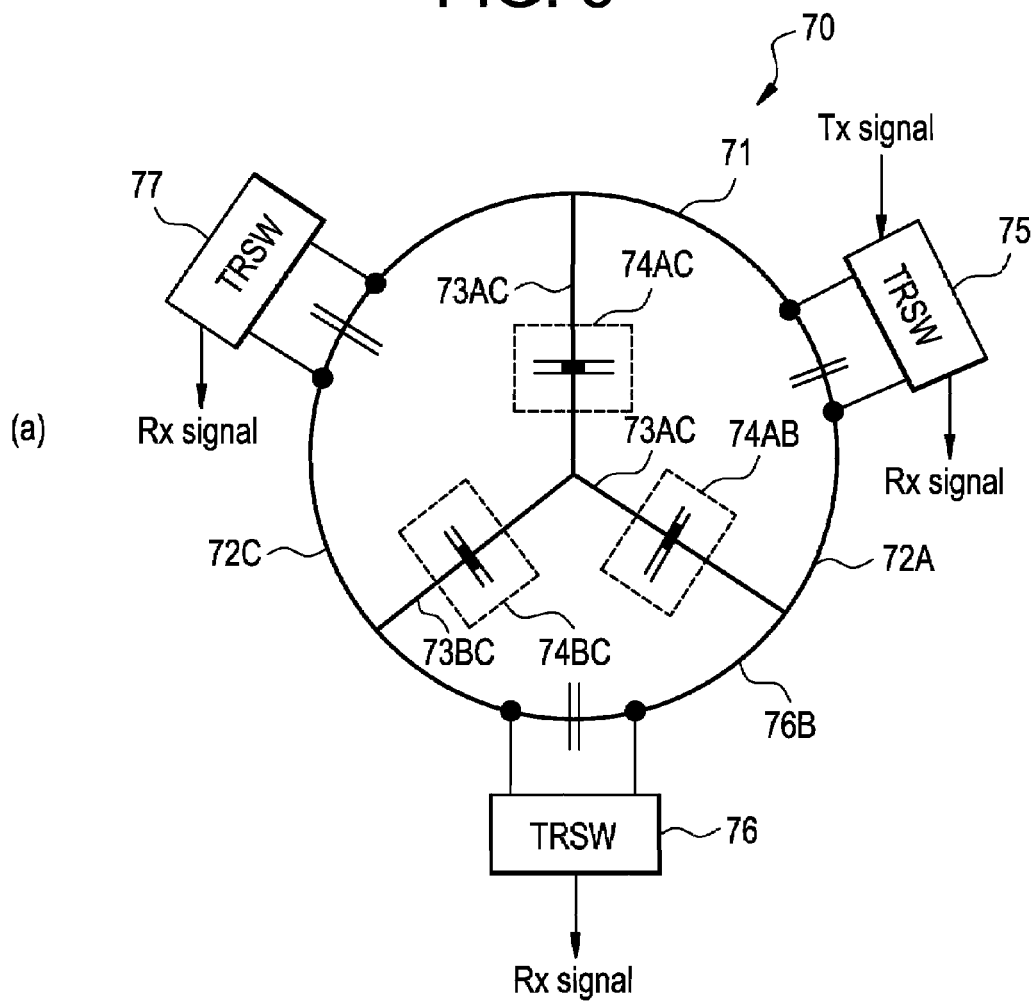
FIGS. 5a and 5b are partially abridged circuit diagrams showing the configuration of the RF coil in a third mode for implementing the invention.
Figure 5:
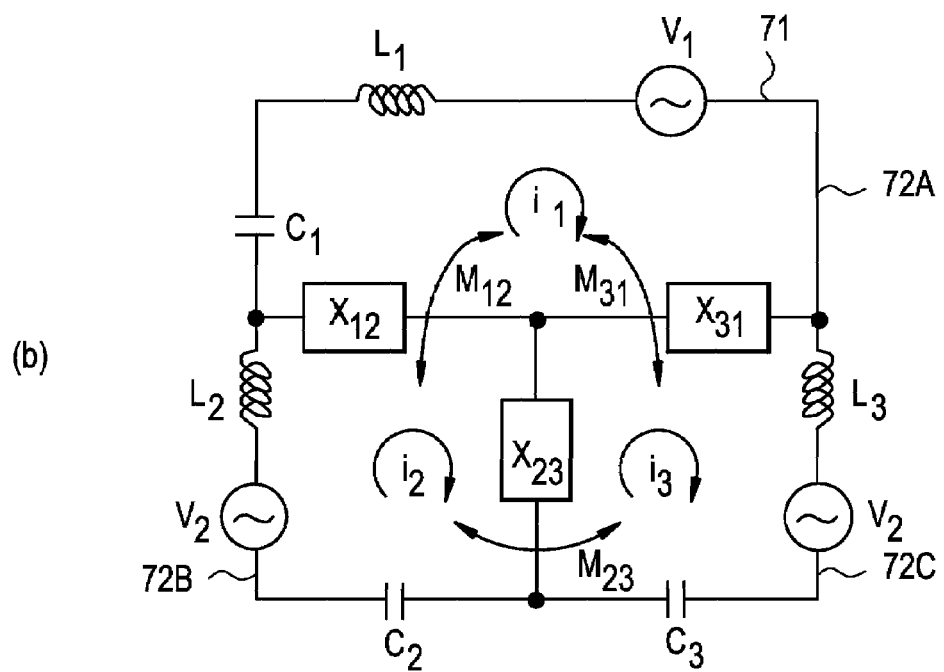
Figure 6:
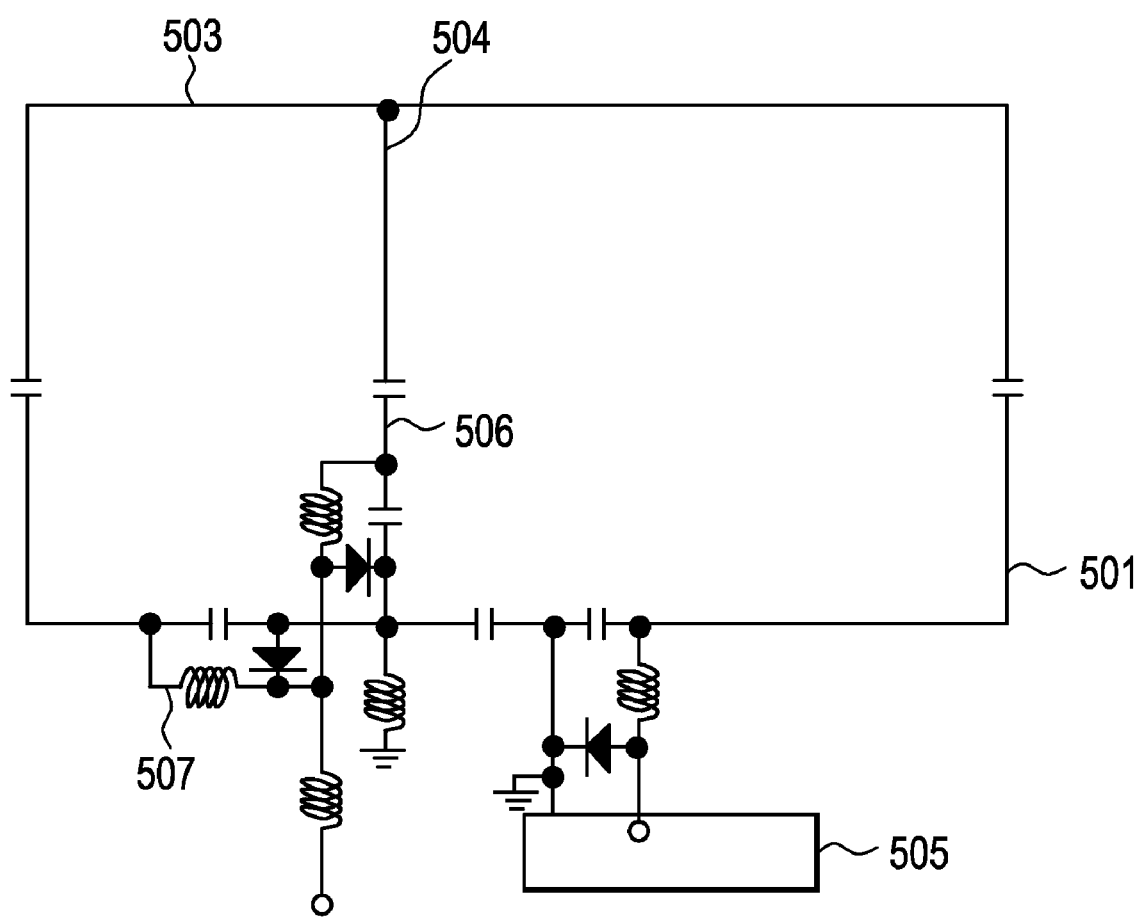
FIG. 6 is a circuit diagram showing a conventional RF coil.

FIG. 5 (a) is a circuit diagram showing an RF coil 70 in the third mode for implementation with partial omissions. The RF coil 70 is provided with an original loop unit 71 and splits of the RF coil 70 divided into split loop units 72A, 72B and 72C.

The original loop unit 71 is formed containing a substantially circular-shaped element, and a capacitor and an inductor are appropriately connected in series to it so as to configure a resonance circuit whose resonance frequency is a prescribed operation frequency.

The split loop units 72A, 72B and 72C are formed by the connection of conductors 73AB, 73BC and 73CA to the original loop unit 51 and the splitting of the original loop unit 71, and each contains part of the element of the original loop unit and two out of the conductors 73AB, 73BC and 73CA.

The conductors 73AB, 73BC and 73CA are formed of the same material and in the same sectional shape as, for instance, the element of the original loop unit 71. Further, the conductors 73AB, 73BC and 73CA are formed, for instance, in a linear shape extending from the circumference side of the original loop unit 71 toward the center, and the split loop units 72A, 72B and 72C are formed in sector shapes equal in center angle. The conductors 73AB, 73BC and 73CA are provided with capacitors or inductors as required so as to cause the split loop units 72A, 72B and 72C to configure a resonance circuit whose resonance frequency is a prescribed operation frequency.

Switch-over units 74A, 74B and 74C have a similar configuration to the switch-over unit 54 in the first mode for implementation. A TR switch 75 has a similar configuration to the TR switch 65 in the second mode for implementation, and TR switches 76 and 77 have a similar configuration to the TR switch 66 in the second mode for implementation.

In the RF coil 70, too, as in the first mode for implementation, the static capacitances on the conductors 73AB, 73BC and 73CA are so set as to achieve isolation among the split loop units 72A, 72B and 72C. A more specific description follows.

FIG. 5(b) is a circuit diagram showing an equivalent circuit to the RF coil 70. Capacitors C1, C2 and C3 and inductors L1, L2 and L3 respectively represent capacitors and inductors equivalent to the capacitors and inductors on the element of the original loop unit 71 contained in the split loop units 72A, 72B and 72C, and elements $X_{12}$, $X_{23}$ and $X_{31}$ represent all the equivalent elements having impedances on the conductors 73AB, 73BC and 73CA. The mutual inductances of the split loop units 72A, 72B and 72C are supposed to be $M_{12}$, $M_{23}$ and $M_{31}$. Here, supposing that voltages $V_1$, $V_2$ and $V_3$ are applied and currents i1, i2 and i3 flow to the split coils 72A, 72B and 72C, respectively, the following equations will hold.

$$V_1 = X_{C1}i_1 + X_{L1}i_1 + X_{12}i_1 + X_{31}i_1 - X_{12}i_2 - X_{M12}i_2 - X_{31}i_3 - X_{M31}i_3$$

$$V_2 = X_{C2}i_2 + X_{L2}i_2 + X_{12}i_2 + X_{23}i_2 - X_{12}i_1 - X_{M12}i_1 - X_{23}i_3 - X_{M23}i_3$$

$$V_3 = X_{C3}i_3 + X_{L3}i_3 + X_{23}i_3 + X_{31}i_3 - X_{23}i_2 - X_{M23}i_2 - X_{31}i_1 - X_{M31}i_1$$

where $X_{c1}$, $X_{c2}$ and $X_{c3}$, $X_{L1}$, $X_{L2}$ and $X_{L3}$, $X_{12}$, $X_{23}$ and $X_{31}$, and $X_{M12}$, $X_{M23}$ and $X_{M31}$ are the respective impedances of the capacitors C1, C2 and C3, the inductors L1, L2 and L3, the elements $X_{12}$, $X_{23}$ and $X_{31}$, and the mutual inductances $M_{12}$, $M_{23}$ and $M_{31}$.

To rearrange the foregoing equations:

$$V_1 = (X_{C1} + X_{L1} + X_{12} + X_{31})i_1 - (X_{12} + XM_{12})i_2 - (X_{S1} + X_{M31})i_3$$

$$V_2 = (X_{C2} + X_{L2} + X_{12} + X_{23})i_2 - (X_{12} + X_{M12})i_1 - (X_{23} + X_{M23})i_3$$

$$V_3 = (X_{C3} + X_{L3} + X_{23} + X_{31})i_3 - (X_{23} + X_{M23})i_2 - (X_{31} + X_{M31})i_1$$

If the split loop units 52A and 52B are isolated from each other, in other words if they are mutually unaffected by the other's current, the term of crosstalk will be 0, and therefore:

$$-(X_{12} + X_{M12})i_2 - (X_{31} + X_{M31})i_3 = 0$$

$$-(X_{12} + X_{M12})i_1 - (X_{23} + X_{M23})i_3 = 0$$

$$-(X_{23} + X_{M23})i_2 - (X_{31} + X_{M31})i_1 = 0$$

or where the term of crosstalk is 0 irrespective of i1, i2 and i3:

$$X_{12} + X_{M12} = 0$$

$$X_{23} + X_{M23} = 0$$

$$X_{31} + X_{M31} = 0$$

Therefore, as in the first mode for implementation, $X_{12}$, $X_{23}$ and $X_{31}$ are static capacitances, $$\therefore X_{12} = 1/(\omega^2 M_{12}), X_{23} = 1/(\omega^2 M_{23}),$$

$$X_{31} = 1/(\omega^2 M_{31})$$

holds.

Incidentally, $\omega$ is the operation frequency of the RF coil 70.

The third mode for implementation described so far can provide similar effects to the second mode for implementation.

The present invention is not limited to the modes for implementation described above, but can be implemented in various other modes.

The RF coil may be any appropriate coil having a loop unit for performing transmission and reception, but is not limited to a surface coil or a phased array coil. For instance, it may as well be a body coil or a coil dedicated to imaging of a specific region. The number of splits of the original loop unit can be set to any appropriate value, and not limited to two or three.

Many widely different embodiments of the invention may be configured without departing from the spirit and the scope of the present invention. It should be understood that the present invention is not limited to the specific embodiments described in the specification, except as defined in the appended claims.

The invention claimed is:

1. A radiofrequency (RF) coil for use in a magnetic resonance imaging apparatus, said RF coil comprising:
   an original loop unit;
   a conductor connected to said original loop unit such that said conductor divides said original loop unit into a plurality of split loop units;
   an electrostatic capacitance element connected in series to said conductor; and
   a switching device configured to make said conductor one of conductive and non-conductive, wherein:
   an electrostatic capacitance of said electrostatic capacitance element is set in order to prevent interference between said plurality of split loop units when said conductor is made conductive by said switching device, the electrostatic capacitance based at least partially on a mutual inductance between said plurality of split loop units and a resonance frequency of one of said original loop unit and said plurality of split loop units.

2. The RF coil according to claim 1, wherein:
   the electrostatic capacitance of said electrostatic capacitance element is set to hold:

$Cm = 1/(\omega 2M)$ where Cm is a synthetic static capacitance on of said conductor shared by two mutually adjoining split loop units of said plurality of split loop units, M is the mutual inductance between said two mutually adjoining split loop units, and $\omega$ is the resonance frequency of one of said original loop unit and said plurality of split loop units.

3. The RF coil according to claim 1, wherein:
   the electrostatic capacitance of said electrostatic capacitance element is set in order to equalize a resonance frequency of said original loop unit and a resonance frequency of at least one split loop unit of said plurality of split loop units.

4. The RF coil according to claim 2, wherein:
   the electrostatic capacitance of said electrostatic capacitance element is set in order to equalize the resonance frequency of said original loop unit and the resonance frequency of at least one split loop unit of said plurality of split loop units.

5. The RF coil according to claim 1, wherein:
   said switching device comprises a parallel oscillation circuit comprising:
   a switch-over electrostatic capacitance element connected in series to said conductor;
   an inductance element connected in parallel to said switch-over electrostatic capacitance element; and
   a diode connected in series to said inductance element.

6. The RF coil according to claim 2, wherein:
said switching device comprises a parallel oscillation circuit comprising:
a switch-over electrostatic capacitance element connected in series to said conductor;
an inductance element connected in parallel to said switch-over electrostatic capacitance element; and
a diode connected in series to said inductance element.

7. The RF coil according to claim 3, wherein:
said switching device comprises a parallel oscillation circuit comprising:
a switch-over electrostatic capacitance element connected in series to said conductor;
an inductance element connected in parallel to said switch-over electrostatic capacitance element; and
a diode connected in series to said inductance element.

8. A magnetic resonance imaging apparatus comprising:
a magnetostatic field forming unit configured to form a magnetostatic field;
a gradient magnetic field forming unit configured to form a gradient magnetic field;
a radiofrequency (RF) coil configured to at least one of apply a high frequency magnetic field in a subject within the magnetostatic field and receive magnetic resonance signals from the subject; and
an image forming unit configured to form tomographic images of the subject based on the magnetic resonance signals which have been received, said RF coil comprising:
an original loop unit;
a conductor connected to said original loop unit such that said conductor divides said original loop unit into a plurality of split loop units;
an electrostatic capacitance element connected in series to said conductor; and
a switching device configured to make said conductor one of conductive and non-conductive, wherein:
an electrostatic capacitance of said electrostatic capacitance element is set in order to prevent interference between said plurality of split loop units when said conductor is made conductive by the switching device, the electrostatic capacitance based at least partially on a mutual inductance between said plurality of split loop units and a resonance frequency of one of said original loop unit and said plurality of split loop units.

9. The magnetic resonance imaging apparatus according to claim 8, further comprising:
a receiver unit connected to a first split loop unit of said plurality of split loop units, said receiver unit configured to one of amplify, when said conductor is conductive, the magnetic resonance signals received from said first split loop unit and amplify, when said conductor is non-conductive, the magnetic resonance signals received from said original loop unit.

10. The magnetic resonance imaging apparatus according to claim 9, wherein:
the electrostatic capacitance of said electrostatic capacitance element is set in order to equalize a resonance frequency of said original loop unit and a resonance frequency of said first split loop unit to which said receiver unit is connected.

11. The magnetic resonance imaging apparatus according to claim 8, further comprising:
a control device configured to control said switching device.

12. The magnetic resonance imaging apparatus according to claim 9, further comprising:
a control device configured to control said switching device.

13. The magnetic resonance imaging apparatus according to claim 10, further comprising:
a control device configured to control said switching device.

14. A reception coil for a magnetic resonance imaging apparatus, said reception coil comprising:
an original loop unit;
a conductor bisecting said original loop unit to form a second loop unit and a third loop unit;
an electrostatic capacitance element; and
a switching device coupled to said conductor, said switching device configured to enable said conductor to conduct electricity in a first mode of operation and inhibit said conductor from conducting electricity in a second mode of operation such that interference between said second loop unit and said third loop unit is prevented according to a capacitance of said electrostatic capacitance element when said conductor is set to operate in the first mode of operation, the capacitance based at least partially on a mutual inductance between said second loop unit and said third loop unit and a resonance frequency of one of said original loop unit, said second loop unit, and said third loop unit.

15. A reception coil in accordance with claim 14 wherein said electrostatic capacitance element is connected in series to said conductor.

16. A reception coil in accordance with claim 15 wherein the capacitance of said electrostatic capacitance element is determined in accordance with:

$Cm=1/(\omega 2M)$ where Cm is a synthetic static capacitance on said conductor shared by said second loop unit and said third loop unit, M is the mutual inductance between said second loop unit and said third loop unit, and $\omega$ is the resonance frequency of one of said original loop unit, said second loop unit, and said third loop unit.

17. A reception coil in accordance with claim 14 wherein the capacitance of said electrostatic capacitance element is set to equalize a resonance frequency of said original loop unit and a resonance frequency of at least one of said second loop unit and said third loop unit.

18. A reception coil in accordance with claim 14 wherein said switching device comprises a parallel oscillation circuit comprising:
a switch-over electrostatic capacitance element connected in series to said conductor;
an inductance element connected in parallel to said switch-over electrostatic capacitance element; and
a diode connected in series to said inductance element.

19. A reception coil in accordance with claim 18 wherein said switching device is configured to forward bias said diode to enable said conductor to conduct electricity in the first mode of operation and to reverse bias said diode to inhibit said conductor from conducting electricity in the second mode of operation.

20. A reception coil in accordance with claim 18 wherein said switching device is configured to forward bias said diode such that at least one of said second loop unit and said third loop unit outputs a magnetic resonance signal to a receiver, said switching device further configured to reverse bias said diode such that said original loop unit outputs the magnetic resonance signal to said receiver.

* * * * *